United States Patent
Yang et al.

(10) Patent No.: US 9,431,910 B1
(45) Date of Patent: Aug. 30, 2016

(54) ENERGY RECYCLING SYSTEM AND RECYCLING METHOD THEREOF

(71) Applicants: NATIONAL CHIAO TUNG UNIVERSITY, Hsinchu (TW); NATIONAL TSING HUA UNIVERSITY, Hsinchu (TW)

(72) Inventors: Chia-Hsiang Yang, New Taipei (TW); Ping-Hsuan Hsieh, Hsinchu County (TW); Cheng-Yen Lee, Taipei (TW)

(73) Assignees: NATIONAL CHIAO TUNG UNIVERSITY, Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/793,750

(22) Filed: Jul. 8, 2015

(30) Foreign Application Priority Data

Mar. 31, 2015 (TW) .............................. 104110509 A

(51) Int. Cl.
*G11C 5/14* (2006.01)
*H02M 3/24* (2006.01)
*G06F 17/50* (2006.01)

(52) U.S. Cl.
CPC ............ *H02M 3/24* (2013.01); *G06F 17/5072* (2013.01); *G11C 5/14* (2013.01)

(58) Field of Classification Search
CPC . G06F 1/10; G11C 11/1697; G11C 11/2297; H02J 3/38; H02J 9/04; G01R 15/185
USPC .............................. 365/226; 307/80; 324/120
See application file for complete search history.

(56) References Cited

U.S. PATENT DOCUMENTS

| 5,473,269 | A | 12/1995 | Dickinson |
| 7,227,803 | B2 * | 6/2007 | Lee ........................ G11C 16/30 365/226 |

(Continued)

FOREIGN PATENT DOCUMENTS

| CN | 101977050 B | 7/2012 |
| TW | 297187 B | 2/1997 |
| TW | 201332244 A | 8/2013 |

OTHER PUBLICATIONS

Y. Moon, and D. K. Jeong, "An efficient charge recovery logic Circuit," IEEE J. Solid-States Circuits, vol. 31, No. 4, pp. 514-522, Apr. 1996.
W. C. Athas, N. Tzartzanis, L. J. Svensson, and L. Peterson, "A low-power microprocessor based on resonant energy," IEEE J. Solid-State Circuits, vol. 32, No. 11, Nov. 1997.
Yibin Ye et al., "QSERL: Quasi-Static energy recovery logic," IEEE J. Solid-State Circuits, vol. 36, No. 2, pp. 239-248, Feb. 2001.

(Continued)

*Primary Examiner* — Huan Hoang
(74) *Attorney, Agent, or Firm* — CKC & Partners Co., Ltd.

(57) ABSTRACT

An energy recycling system and an energy recycling method are disclosed. The energy recycling system includes several working circuits and a first energy recycling circuit. The working circuits include at least one first working circuit and at least one second working circuit. The first energy recycling circuit is coupled between the first working circuits and the second working circuits. The first alternating-current-type (AC-type) voltage source is supplied to the first working circuits and the second working circuits. The energy loss of the first AC-type voltage source is replenished by a direct-current-type (DC-type) voltage source. The first energy recycling circuit includes an inductor and pairs of switches, and the pairs of switches are configured for conducting in different time sequences and transferring the energy of the first AC-type voltage source between the first working circuits, the inductor and the second working circuits.

10 Claims, 9 Drawing Sheets

(56) References Cited

U.S. PATENT DOCUMENTS

| | | |
|---|---|---|
| 7,355,454 B2 | 4/2008 | Papaefthymiou et al. |
| 7,746,117 B2 | 6/2010 | Hong et al. |
| 8,680,870 B2 | 3/2014 | Chung et al. |
| 8,724,422 B1 * | 5/2014 | Agness .................. G11O 5/147 365/226 |
| 2015/0084425 A1 | 3/2015 | Williams |

OTHER PUBLICATIONS

W.H. Ma, J. Kao, V. Sathe, and M. Papaefthymiou, "187 MHz subthreshold-supply charge-recovery FIR," IEEE J. Solid-State Circuits, vol. 45, No. 4, pp. 793-803, Apr. 2010.

Tai-Chuan Ou et al., "An 821MHz 7.9Gb/s 7.3pJ/b/iteration charge-recovery LDPC decoder," ISSCC Dig. Tech. Papers, pp. 462-463, 2014.

* cited by examiner

ENERGY RECYCLING SYSTEM AND RECYCLING METHOD THEREOF

RELATED APPLICATIONS

This application claims priority to Taiwanese Application Serial Number 104110509, filed Mar. 31, 2015, which is herein incorporated by reference.

BACKGROUND

1. Field of Invention

The present disclosure relates to an energy recycling system and an energy recycling method thereof. More particularly, the present disclosure relates to an energy recycling system, which makes energy transferred between working circuits, and an energy recycling method thereof.

2. Description of Related Art

Due to the rise of environmental awareness, all circuits require energy saving, for example high power circuits for electrical generating systems, moderate power circuits such as electrical appliances and mobile phones, or even low power circuits such as logic circuits. Therefore, an energy saving system has entered the mainstream of present day technology. However, there are still many problems in the energy recycling system of the logic circuits which must be solved, such as utilizing a large number of transistors in order to provide the voltage source with multiple phases, the configuration of circuits being too complicated which may need a fully customized design, the voltage source generated being unstable, or the energy recycling system being only suited to the system with the bulk capacitor.

SUMMARY

The following presents a simplified summary of the disclosure in order to provide a basic understanding to the reader. This summary is not an extensive overview of the disclosure and it does not identify key/critical components of the present disclosure or delineate the scope of the present disclosure. Its sole purpose is to present some concepts disclosed herein in a simplified form as a prelude to the more detailed description that is presented later.

One aspect of the present disclosure is to provide an energy recycling system. The energy recycling system includes several working circuits and a first energy recycling circuit. The working circuits include at least one first working circuit and at least one second working circuit, wherein the first working circuits and the second working circuits are alternately coupled with each other in series. The first energy recycling circuit includes an inductor and several pairs of switches. The first energy recycling circuit, coupled between the first working circuits and the second working circuits, a first alternating-current-type (AC-type) voltage source is supplied to the first working circuits and the second working circuits. The energy loss of the first AC-type voltage source is replenished by a direct-current-type (DC-type) voltage source. The pairs of switches, configured for conducting in different time sequences and transferring the energy of the first AC-type voltage source between the first working circuits, the inductor and the second working circuits.

Another aspect of the present disclosure is to provide a circuit layout method utilized in the aforementioned energy recycling system. The method includes: disposing a first metal trace configured for transferring the first AC-type voltage source; and disposing a second metal trace above and vertically overlapping to the first metal trace, wherein the second metal trace is configured for transferring the second AC-type voltage source, and the first metal trace and the second metal trace are not electrically coupled with each other.

Still another aspect of the present disclosure is to provide an energy recycling method utilized in an energy recycling system including at least one working circuit and at least one second working circuit and a first energy recycling circuit, wherein the first working circuits and the second working circuits are alternately coupled with each other in series, and the first working circuits have a first equivalent parasitic capacitor, and the second working circuits have a second equivalent parasitic capacitor. The energy recycling method includes: in the initial time sequence, transference of the energy of the first AC-type voltage source from a DC-type voltage source to the first equivalent parasitic capacitor; in a secondary time sequence, transference of the energy of the first AC-type voltage source from the first equivalent parasitic capacitor to an inductor; and in a tertiary time sequence, transference of the energy of the first AC-type voltage source from the inductor to the second equivalent parasitic capacitor, wherein the initial time sequence, the secondary time sequence and the tertiary time sequence are different time sequences.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
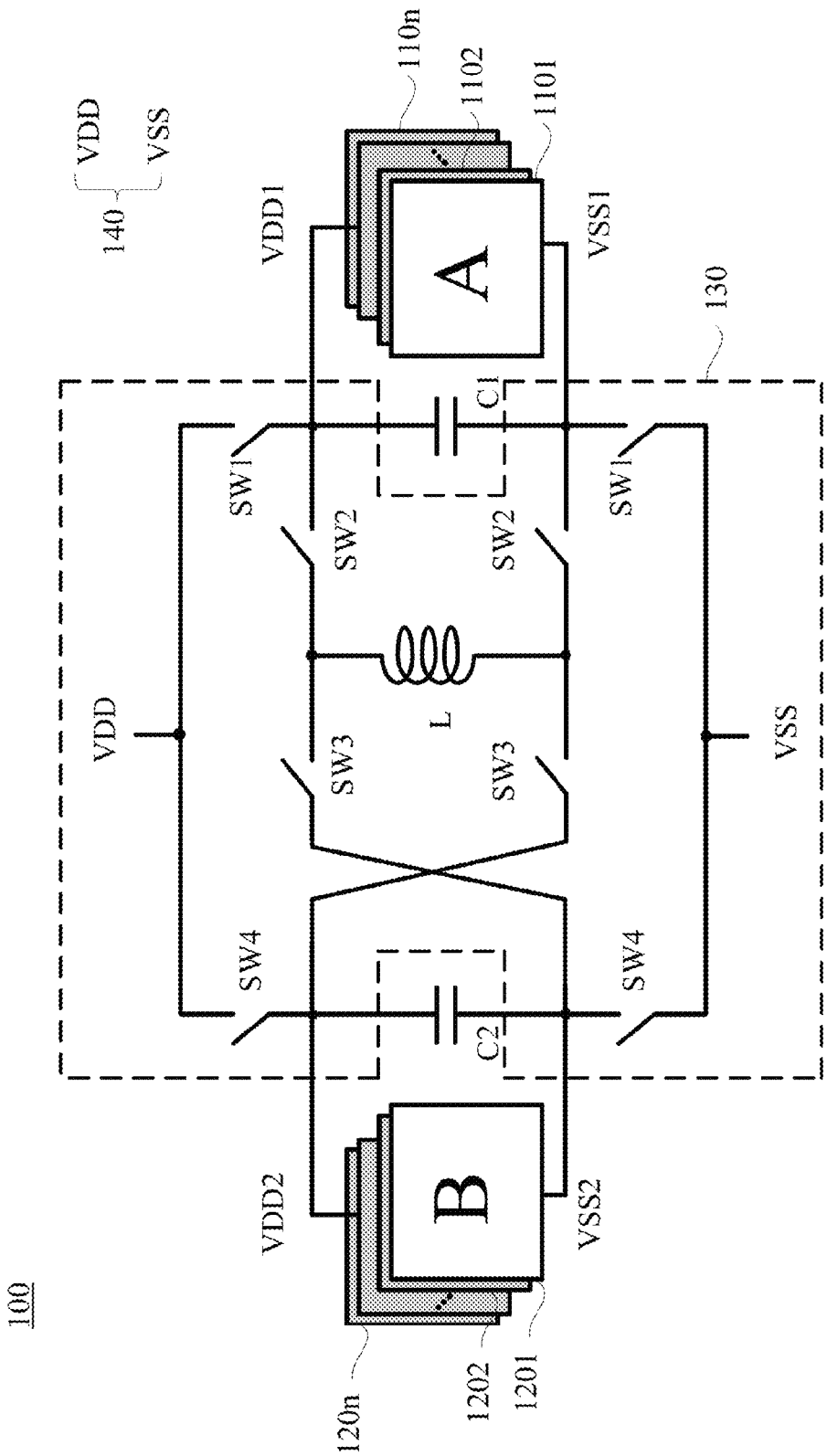
FIG. 1 is a schematic diagram illustrating an energy recycling system according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a schematic diagram illustrating an energy recycling system 100 according to an embodiment of the present disclosure. As shown in FIG. 1, the energy recycling system 100 is configured to provide electricity to load circuits for processing logic operation of signals. In practice, the load circuits can be central processing units (CPUs), comparators, memory modules, gate drivers, shift registers, inverters or any other logical circuits for processing logic operation of signals. In the present disclosure, the energy recycling system 100 reuses the electricity by transferring the energy alternately between the load circuits For example, the abovementioned load circuits may include several working units, and each of the working circuits may be coupled with each other in series and respectively process different functions to data signals, such as signal amplifying, signal determining, signal comparing and signal registering. In the embodiment, the working units of the load circuits can be separated according to the odd-even order of the working units into first working circuits (odd-ordered) and second working circuits (even-ordered).

As shown in FIG. 1, the energy recycling system 100 includes first working circuits 1101~110n, second working circuits 1201~120n and a first energy recycling circuit 130. The first working circuits 1101~110n have a first equivalent parasitic capacitor C1 and the second working circuits 1201~120n have a second equivalent parasitic capacitor C2. The first energy recycling circuit 130 further includes a first pair of switches SW1, a second pair of switches SW2, a third pair of switches SW3, a fourth pair of switches SW4 and an inductor L. The first working circuits 1101~110n and the second working circuits 1201~120n are configured to process the logic operation of signals. In practice, the first working circuits 1101~110n and the second working circuits 1201~120n can be central processing units (CPUs), comparators, memory modules, gate drivers, shift registers, inverters or any other logical circuits for processing the logic operation of the signals.

Figure 2:
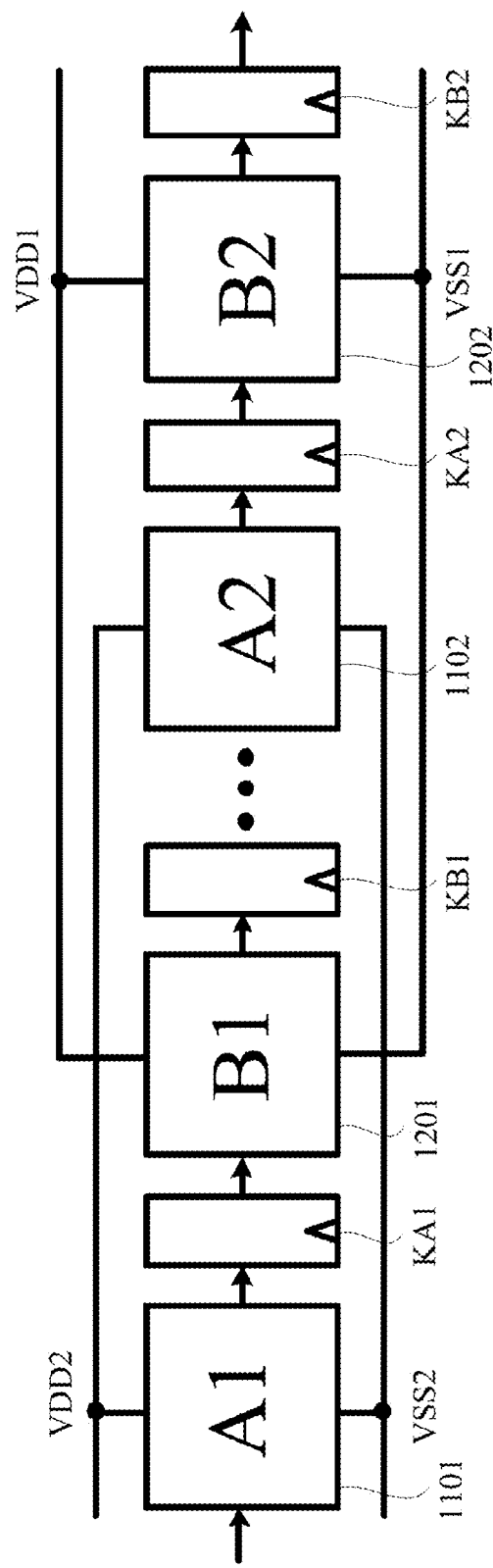
FIG. 2 is a schematic diagram illustrating the alternate connection of the first working circuits and the second working circuits with each other in series in FIG. 1.

Reference is also made to FIG. 2, the loading circuits such as the first working circuits 1101~110n and the second working circuits 1201~120n are alternately coupled with each other in series. In addition, First memory circuits KA1~KAn and second memory circuits KB1~KBn are coupled between each of the working circuits, and it should be noted that FIG. 2 only illustrates KA1 and KA2 to represent KA1~KAn, and KB1 and KB2 to represent KB1~KBn. The first working circuit 1101 may transmit the signals to the second working circuit 1102 after the signals are processed, and then in the same manner, the signals may be transmitted to the first working circuit 1102 and the second working circuit 1202. Therefore, the order of processing of the signals is alternately changed between the first working circuits 1101~110n and the second working circuits 1201~120n. It should be noted that the first working circuits 1101~110n and the second working circuits 1201~120n are respectively coupled to different supply voltages, for example, the first working circuits 1101~110n are coupled with a first high level supply voltage VDD1 and a first low level supply voltage VSS1, on the other hand, the second working circuits 1201~120n are coupled with a first high level supply voltage VDD2 and a first low level supply voltage VSS2. In order to make the energy recycling system easier to understand, FIG. 1 illustrates the first working circuits 1101~110n and the second working circuits 1201~120n in an overlapped manner.

Each of the first working circuits 1101~110n and the second working circuits 1201~120n has a parasitic capacitor (which is not shown in drawings of the present disclosure). Any overlap of metal in the circuits may form the parasitic capacitor, therefore, the parasitic capacitor is naturally formed by the circuits and is not coupled or connected as an external capacitor unit. In this embodiment, all of the parasitic capacitors of the first working circuits compose the first equivalent parasitic capacitor C1, and all of the parasitic capacitors of the second working circuits compose the second equivalent parasitic capacitor C2, as shown in FIG. 1.

The first energy recycling circuit 130 is coupled between the first working circuits 1101~110n and the second working circuits 1201~120n. In the embodiment, a DC-type voltage source 140 includes a high level DC supply voltage VDD and a low level DC supply voltage VSS. The first energy recycling circuit 130 converts the DC voltage source 140 to a first AC-type voltage source 301, 302 by conducting the pairs of switches (i.e., the first pair of switches SW1, the second pair of switches SW2, the third pair of switches SW3 and the fourth pair of switches SW4) in different time sequences, and then respectively supplies the first AC-type voltage source 301, 302 to the first working circuits 1101~110n and the second working circuits 1201~120n. While the pairs of switches conduct in different time sequences, the resonant circuit including the first equivalent parasitic capacitor C1, the second equivalent parasitic capacitor C2 and the inductor L converts the DC-type voltage source 140 to the first AC-type voltage source 301, 302, and reference is also made to FIG. 3.

Figure 3:
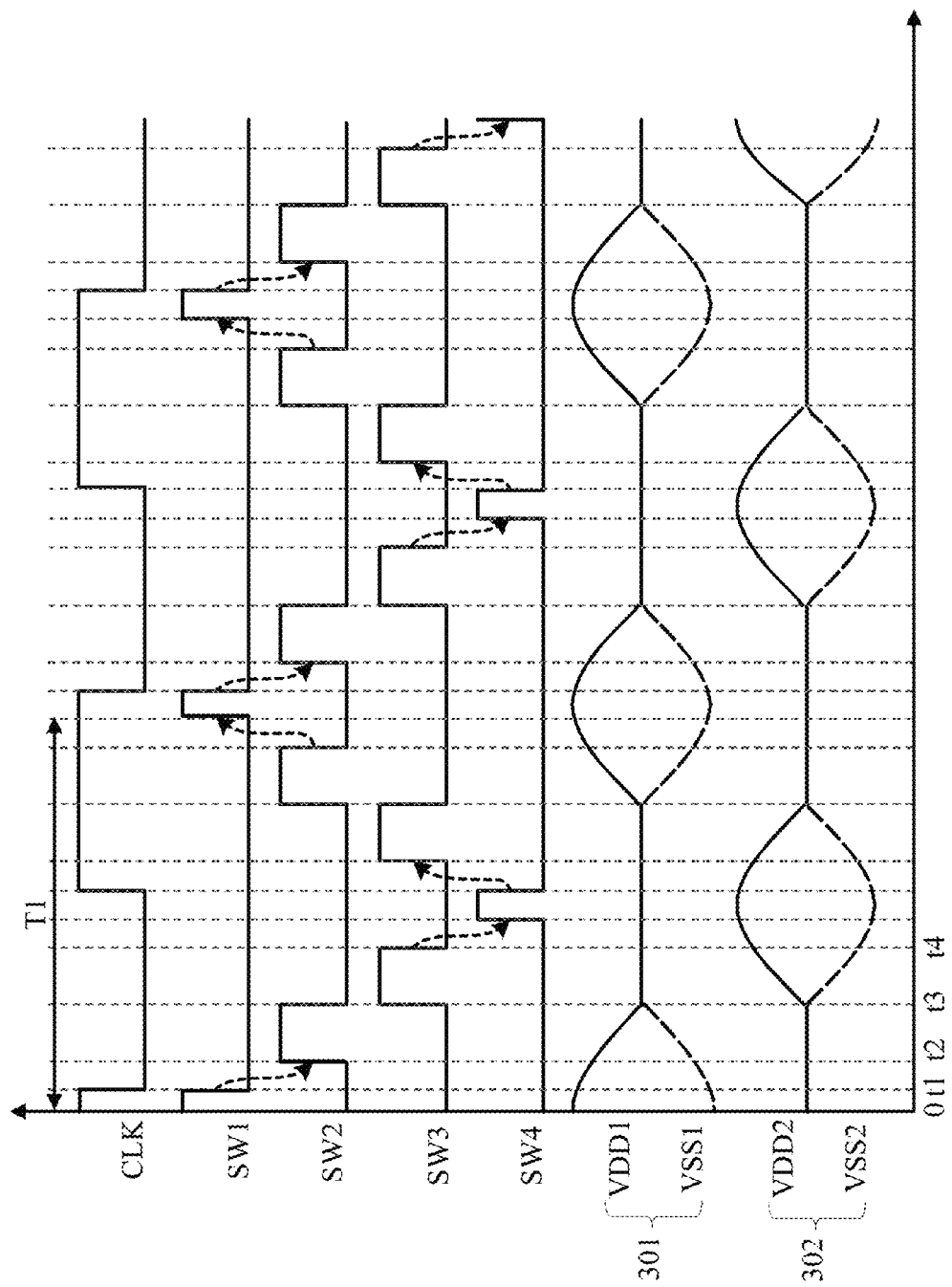
FIG. 3 is a waveform diagram illustrating the control signals of the first pair of switches to the fourth pair of switches and the first AC-type voltage source of the first energy recycling circuit in FIG. 1.

FIG. 3 is a waveform diagram illustrating the control signals of the first pair of switches SW1 to the fourth pair of switches SW4 and the first AC-type voltage source 301, 302 of the first energy recycling circuit 130 in FIG. 1. The first AC-type voltage source 301 includes a first high level supply voltage VDD1 (i.e., the upper half portion of the first AC-type voltage source 301) and a first low level supply voltage VSS1 (i.e., the lower half portion of the first AC-type voltage source 301). The first AC-type voltage source 302 includes a first high level supply voltage VDD2 (i.e., the upper half portion of the first AC-type voltage source 302) and a first low level supply voltage VSS2 (i.e., the lower half portion of the first AC-type voltage source 302). The first AC-type voltage source 301, 302 are respectively supplied to the first working circuits 1101~110n and the second working circuits 1201~120n.

As shown in FIG. 1 and FIG. 3, the first pair of switches SW1 conducts in 0-t1 time sequence, and thus the DC-type voltage source 140 is coupled with the first equivalent parasitic capacitor C1, and the first equivalent parasitic capacitor C1 can be charged. Therefore, in the time sequence, the potential difference between two terminals of the first equivalent parasitic capacitor C1 is largest, i.e., the potential difference between the first high level supply voltage VDD1 and the first low level supply voltage VSS1 is largest, and the energy is transferred from the DC-type voltage source 140 to the first equivalent parasitic capacitor C1.

After the first pair of switches SW1 is cut off, the second pair of switches SW2 conducts in t2-t3 time sequence, and thus the first equivalent parasitic capacitor C1 is coupled with the inductor L, and the inductor L can be charged. Therefore, in the time sequence, the potential difference between the first high level supply voltage VDD1 and the first low level supply voltage VSS1 gradually decreases, and the energy is transferred from the first equivalent parasitic capacitor C1 to the inductor L.

After the second pair of switches SW2 is cut off, the third pair of switches SW3 conducts in t3-t4 time sequence, and thus the inductor L is coupled with the second equivalent parasitic capacitor C2, and the second equivalent parasitic capacitor C2 can be charged. Therefore, in the time sequence, the potential difference between the first high level supply voltage VDD2 and the first low level supply voltage VSS2 gradually increases, and the energy transferred from the inductor L to the second equivalent parasitic capacitor C2. In this manner, the energy can be successively transferred from the DC-type voltage source 140 to the first equivalent parasitic capacitor C1, the inductor L and the second equivalent parasitic capacitor C2.

In addition, the energy loss from transferring or the energy consumed in processing the operation of the signals by the second working circuits 1201~120n can be replenished by conducting the fourth pair of switches SW4. While the fourth pair of switches SW4 conducts, the energy can be transferred from the DC-type voltage source 140 to the second equivalent parasitic capacitor C2. That is to say, the energy loss is replenished by the DC-type voltage source 140. Similarly, the third pair of switches SW3 and the second pair of switches SW2 may successively conduct, and the energy can thus be transferred to the first equivalent parasitic capacitor C1. Finally, the pairs of switches may repeat the energy transferring in the next period T1 according to the clock signal CLK.

As shown in FIG. 2, the order of processing the signals is alternately changed between the first working circuits 1101~110n and the second working circuits 1201~120n. Therefore, by transferring the energy between the first working circuits 1101~110n, the inductor L and the second working circuits 1201~120n, the energy can be transferred to the working circuits while the working circuits are processing the signals, and the energy loss caused by the other working circuits which are not processing the signals can be prevented.

Figure 4:
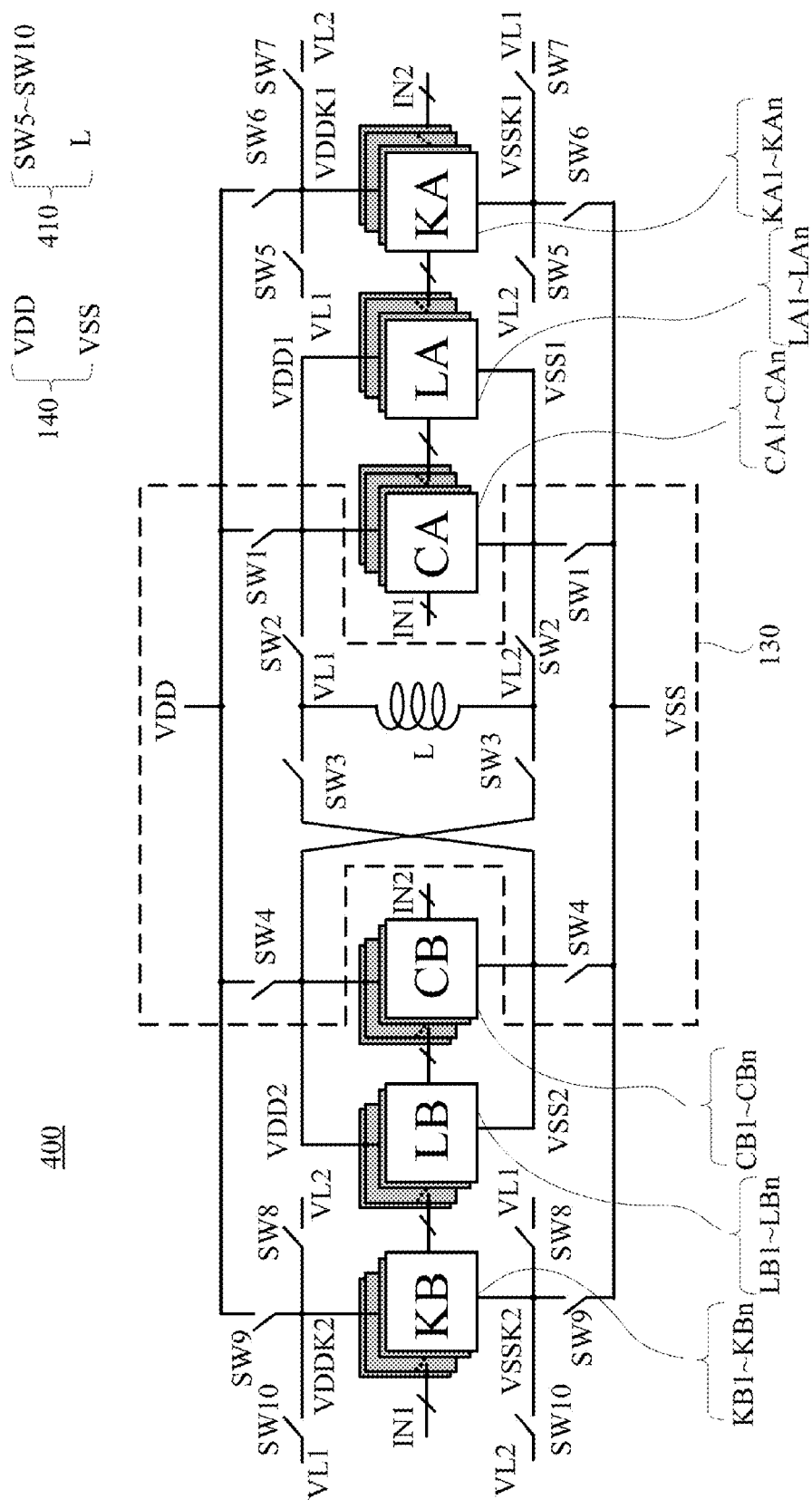
FIG. 4 is a schematic diagram illustrating an energy recycling system according to another embodiment of the present disclosure.

FIG. 4 is a schematic diagram illustrating an energy recycling system 400 according to another embodiment of the present disclosure. In the embodiment, The energy recycling system includes the first energy recycling circuit 130, a second energy recycling circuit 410, the first working circuits 1101~110n, the second working circuits 1201~120n, the first memory circuits KA1~KAn and the second memory circuits KB1~KBn. The second energy recycling circuit 410 includes the pairs of switches SW5~SW10 and the inductor L. The first working circuits 1101~110n include logic circuits CA1~CAn and register circuits LA1~LAn. The second working circuits 1201~120n include logic circuits CB1~CBn and register circuits LB1~LBn.

Figure 5:
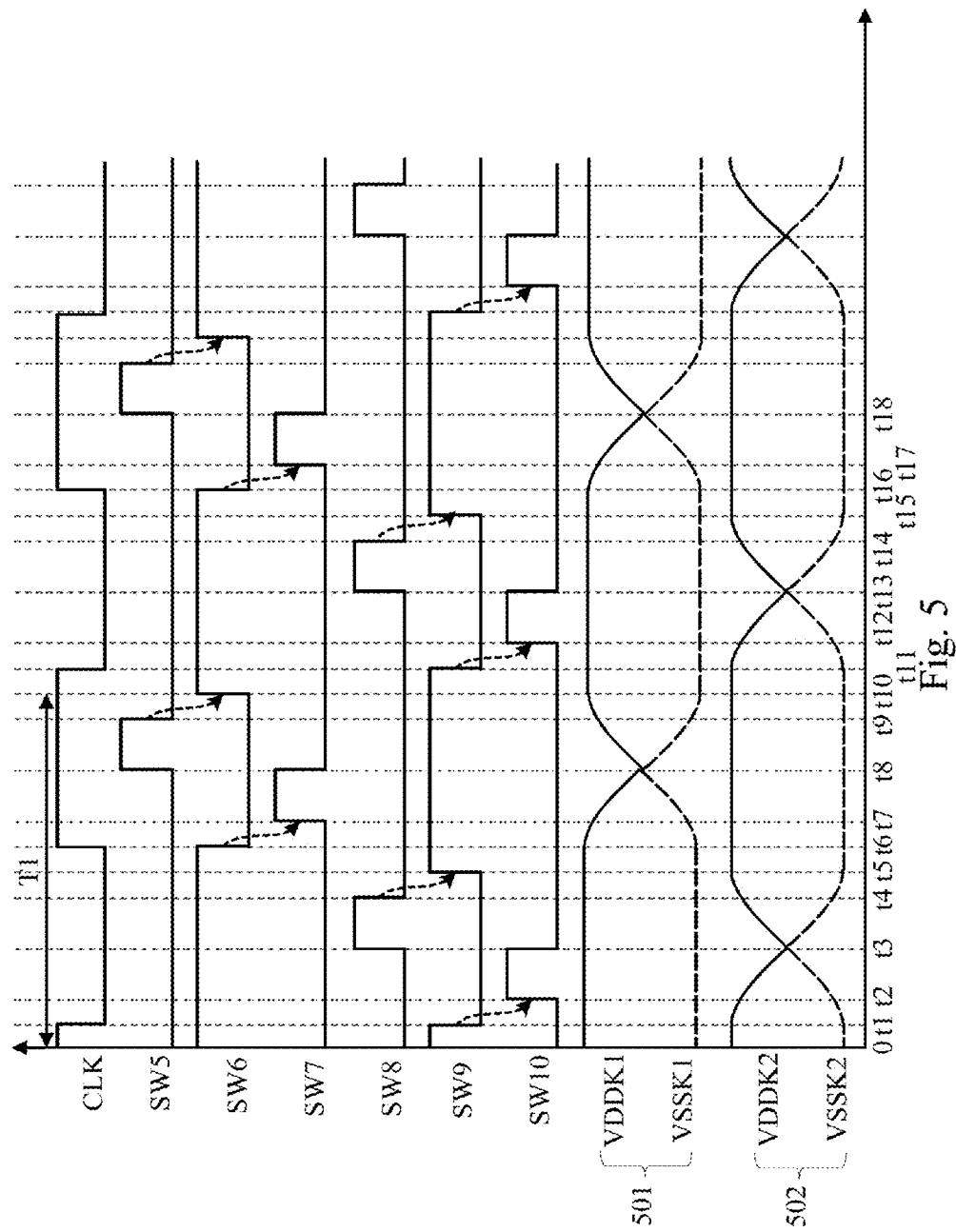
FIG. 5 is a waveform diagram illustrating the control signals of the fifth pair of switches to the tenth pair of switches and the second AC-type voltage source of the energy recycling system in FIG. 4.

Similarly, the second energy recycling circuit 410 converts the DC-type voltage source 140 to a second AC-type voltage source 501, 502 by conducting the pairs of switches SW5~SW10 in different time sequences, and then respectively supplies the second AC-type voltage source 501, 502 to the first memory circuits KA1~KAn and the second memory circuits KB1~KBn and reference is also made to FIG. 5. FIG. 5 is a waveform diagram illustrating the control signals of the fifth pair of switches SW5 to the tenth pair of switches SW10 and the second AC-type voltage source 501, 502 of the energy recycling system 400 in FIG. 4. The second AC-type voltage source 501 includes a second high level supply voltage VDDK1 (i.e., the upper half portion of the second AC-type voltage source 501) and a second low level supply voltage VSSK1 (i.e., the lower half portion of the second AC-type voltage source 501). The second AC-type voltage source 502 includes a second high level supply voltage VDDK2 (i.e., the upper half portion of the second AC-type voltage source 502) and a second low level supply voltage VSSK2 (i.e., the lower half portion of the second AC-type voltage source 502). The second AC-type voltage source 501, 502 are respectively supplied to the first memory circuits KA1~KAn and the second memory circuits KB1~KBn.

It should be noted that, the pairs of switches SW5~SW10 are coupled between the inductor L and the DC-type voltage source 140. While the memory circuits (i.e., the first memory circuits KA1~KAn or the second memory circuits KB1~KBn) are preparing to process the storage operation, the energy should be transferred from the inductor L to the memory circuits, therefore the fifth pair of switches SW5 and the eighth pair of switches SW8 may conduct at this time (which is in accordance with t8-t9 time sequence and t3-t4 time sequence in FIG. 5). While the memory circuits are processing the storage operation, the memory circuits should be coupled with the stable DC-type voltage source 140 in order to prevent the energy from being insufficient, in which the insufficient energy may cause storing errors during the storage operation. Therefore the sixth pair of switches SW6 and the ninth pair of switches SW9 may conduct at this time (which is in accordance with t10-t16 time sequence and t5-t11 time sequence in FIG. 5). While the energy should be transferred from memory circuits to the inductor L, the seventh pair of switches SW7 and the tenth pair of switches SW10 may conduct at this time (which is in accordance with t7-t8 time sequence and t12-t13 time sequence in FIG. 5). Finally, the pairs of switches SW5~SW10 may repeat the energy transferring in the next period T1 according to the clock signal CLK. As shown in FIG. 2, the order of storing the signals is alternately changed between the first memory circuits KA1~KAn and the second memory circuits KB1~KBn.

Therefore, by transferring the energy between the first memory circuits KA1~KAn, the inductor L and the second memory circuits KB1~KBn, the energy can be transferred to the memory circuits while the memory circuits are processing the storage operation, and the energy loss caused by the other memory circuits which are not processing the storage operation can be prevented.

Figure 6:
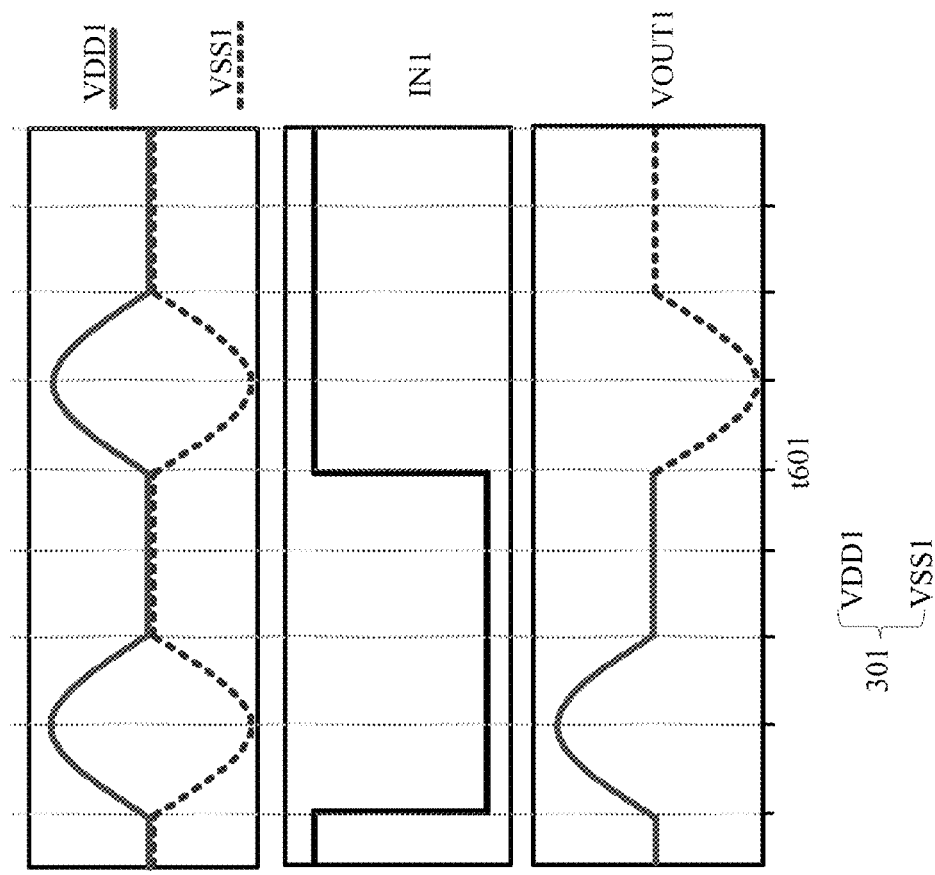
FIG. 6 is a schematic diagram illustrating the logic circuit and its waveform of the energy recycling system in FIG. 4.
Figure 6:
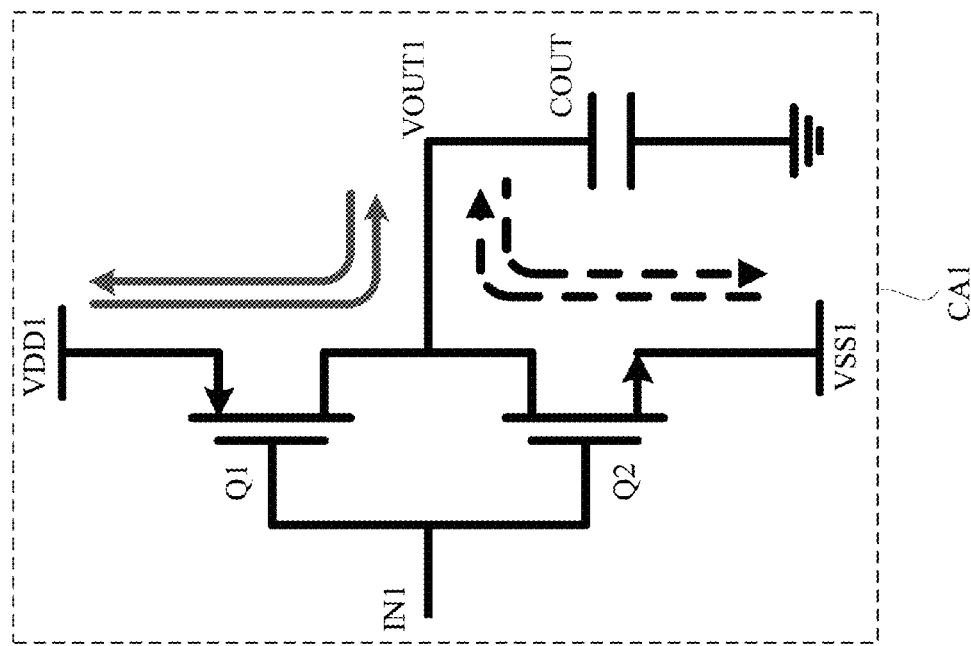

As shown in FIG. 4 and FIG. 6, FIG. 6 is a schematic diagram illustrating the logic circuit CA1 and its waveform of the energy recycling system 400 in FIG. 4. In the embodiment, the logic circuit CA1 is configured to process the logic operation of signals, and the logic circuit CA1 can be an inverter, which includes a p-type transistor, n-type transistor and an output capacitor COUT, but the present disclosure is not limited in this regard. In practice, the logic circuit CA1 can be a central processing unit (CPU), a comparator or one of any other logical circuits for processing the logic operation of signals.

It should be noted that, in general, the inverter would be coupled with a stable DC-type voltage source, however the logic circuit CA1 in the embodiment is coupled with the abovementioned first AC-type voltage source 301. Therefore, the logic circuit CA1 outputs the output signal VOUT1 not only according to an input signal IN1 but also according to the first AC-type voltage source 301. For example, while the input signal IN1 is at low level potential, the logic circuit CA1 may output an upper half portion of an alternating-current signal as the output signal VOUT1 (before the time t601) according to the first high level supply voltage VDD1. On the other hand, while the input signal IN1 is at high level potential, the logic circuit CA1 may output an lower half portion of the alternating-current signal as the output signal VOUT1 (after the time t601) according to the first low level supply voltage VSS1. In the abovementioned manner, the function of inverter can be operated. Therefore, in the embodiment, the logic circuit CA1~CAn and the logic circuit CB1~CBn can not only reduce the energy loss through the first energy recycling circuit 130 but also save the costs and space of the IC chips by utilizing the simple configuration and fewer amount of transistors.

Figure 7:
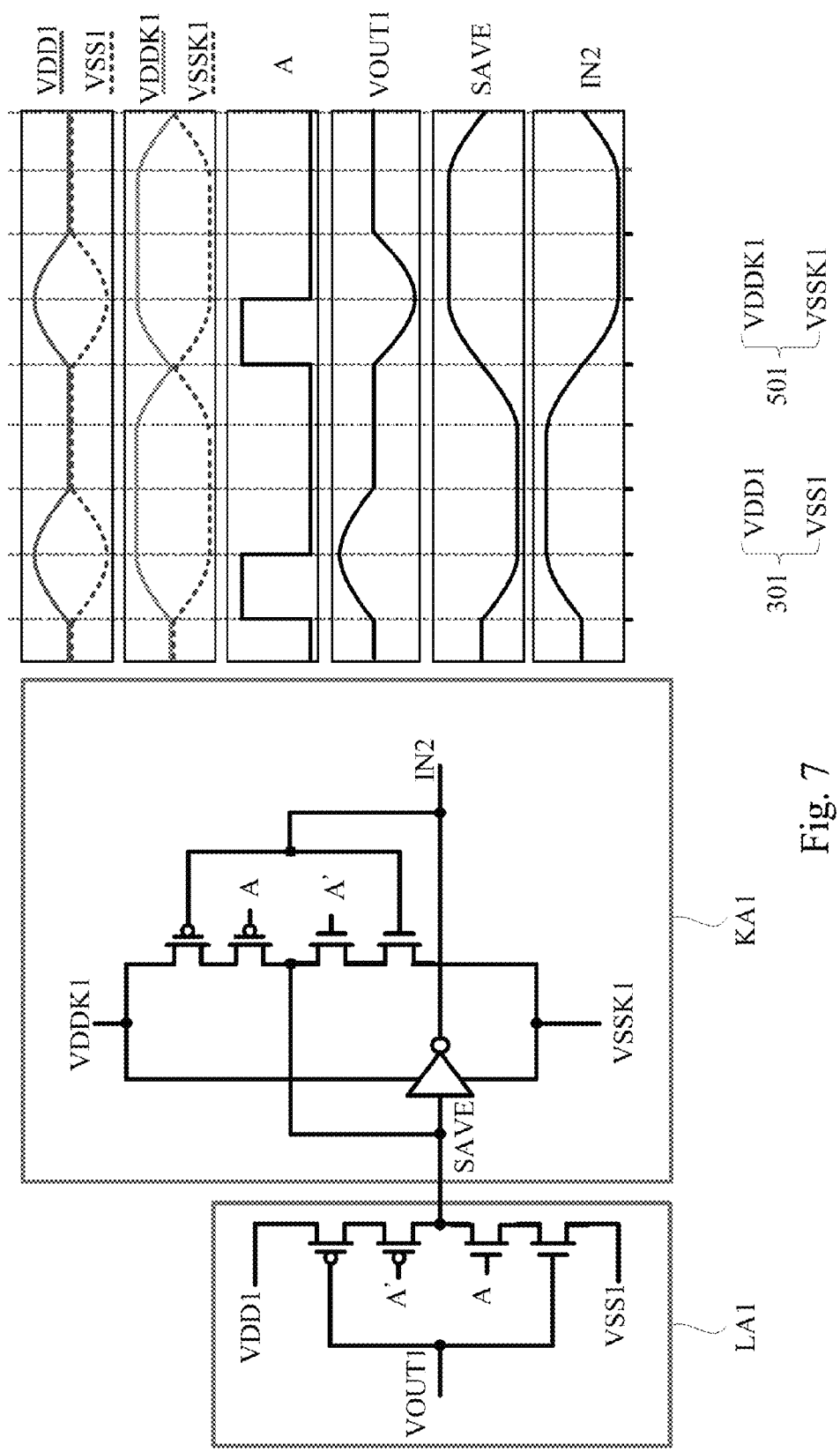
FIG. 7 is a schematic diagram illustrating the register circuit, the first memory circuit and their waveform of the energy recycling system in FIG. 4.

FIG. 7 is a schematic diagram illustrating the register circuit LA1, the first memory circuit KA1 and their waveform of the energy recycling system 400 in FIG. 4. As shown in FIG. 4, the logic circuit CA1, the register circuit LA1 and the first memory circuit KA1 are coupled with each other in series. While the above mentioned logic circuit CA1 transmits the output signal VOUT1 to the register circuit LA1, similarly, the register circuit LA1 may output a memory signal SAVE according to the output signal VOUT1 and the first AC-type voltage source 301. In addition, the control signal A and the control signal A' (whose waveform is complementary to the control signal A and not shown in FIG. 7) utilized in the register circuit LA1 and the first memory circuit KA1 are just one embodiment, and the control signals can be different according to different designs of circuits, and the present disclosure is not limited in this regard.

The first memory circuit KA1 is configured to store the memory signal SAVE form the register circuit LA1 and provide the next working circuit with the signal for processing (which is shown in FIG. 2, the first memory circuit KA1 is coupled with the second working circuit 1201). As mentioned above, the first memory circuit KA1 is coupled with the second AC-type voltage source 501, and thus the first memory circuit KA1 may generate the output signal IN2 according to the memory signal SAVE and the second AC-type voltage source 501. It should be noted that, either the input signal IN1 or the input signal IN2 shown in FIG. 4 is actually not labeled for just one logic circuit, that is to say, all of the input signals of the logic circuits CA1~CAn are all labeled as the input signals IN1, and all of the input signals of the logic circuits CB1~CBn are all labeled as the input signals IN2. For example, the input signal IN1 received by the logic circuit CA1 is transmitted to the register circuit LA1 and the first memory circuit KA1, and then the first memory circuit KA1 generates the input signal IN2 to the logic circuit CB1. In this manner, the input signal IN2 received by the logic circuit CB1 is transmitted to the register circuit LB1 and the second memory circuit KB1, and then the second memory circuit KB1 generates the input signal IN1 to the logic circuit CA2.

Figure 8:
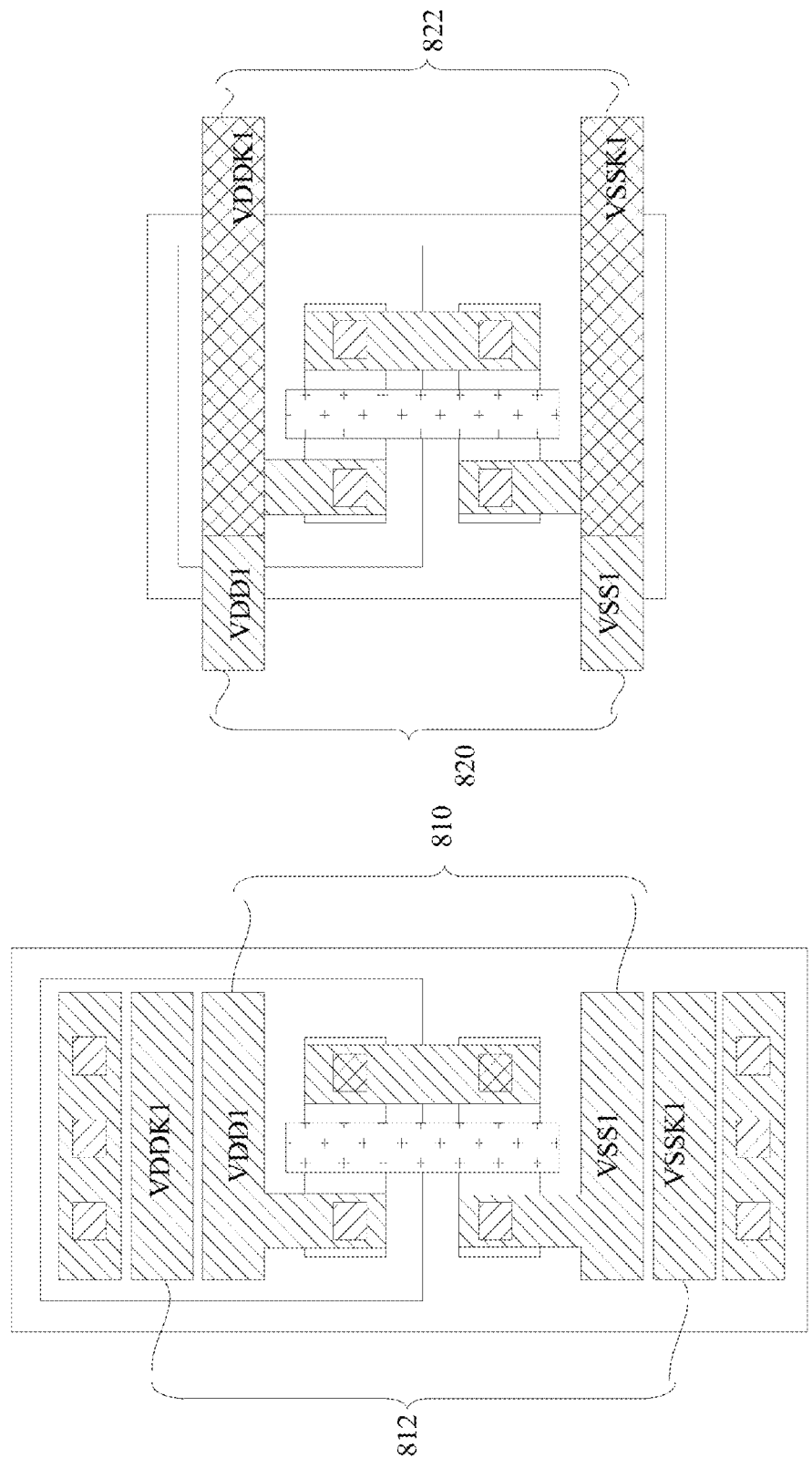
FIG. 8 is a schematic diagram of a circuit layout method according to an embodiment of the present disclosure.

FIG. 8 is a schematic diagram of a circuit layout method according to an embodiment of the present disclosure. As described in the abovementioned embodiment, the first AC-type voltage source 301 and the second AC-type voltage source 501 in the energy recycling system 400 respectively supply to the first working circuits 1101~110n and the first memory circuits KA1~KAn, and thus the first AC-type voltage source 301 and the second AC-type voltage source 501 should be transferred in different metal traces in the circuit layout. As shown in the left half portion of FIG. 8, the metal traces 810, 812 are disposed on the same plane to transfer the first AC-type voltage source 301 and the second AC-type voltage source 501 respectively. That is to say, the metal traces 810, 812 respectively occupy the two different areas on the IC chip. In the circuit layout method of the embodiment as shown in the right half portion of FIG. 8: disposing a metal trace 820 configured for transferring the first AC-type voltage source 301; and disposing a metal trace 822 above and vertically overlapping to the metal trace 820, in which the second metal trace is configured for transferring the second AC-type voltage source. It should be noted that the metal trace 820 and the metal trace 822 are not electrically coupled with each other, that is to say, the metal trace 820 and the metal trace 822 are disposed on different planes. By utilizing the circuit layout method, the areas occupied by the metal traces on the IC chip can be greatly reduced.

Figure 9:
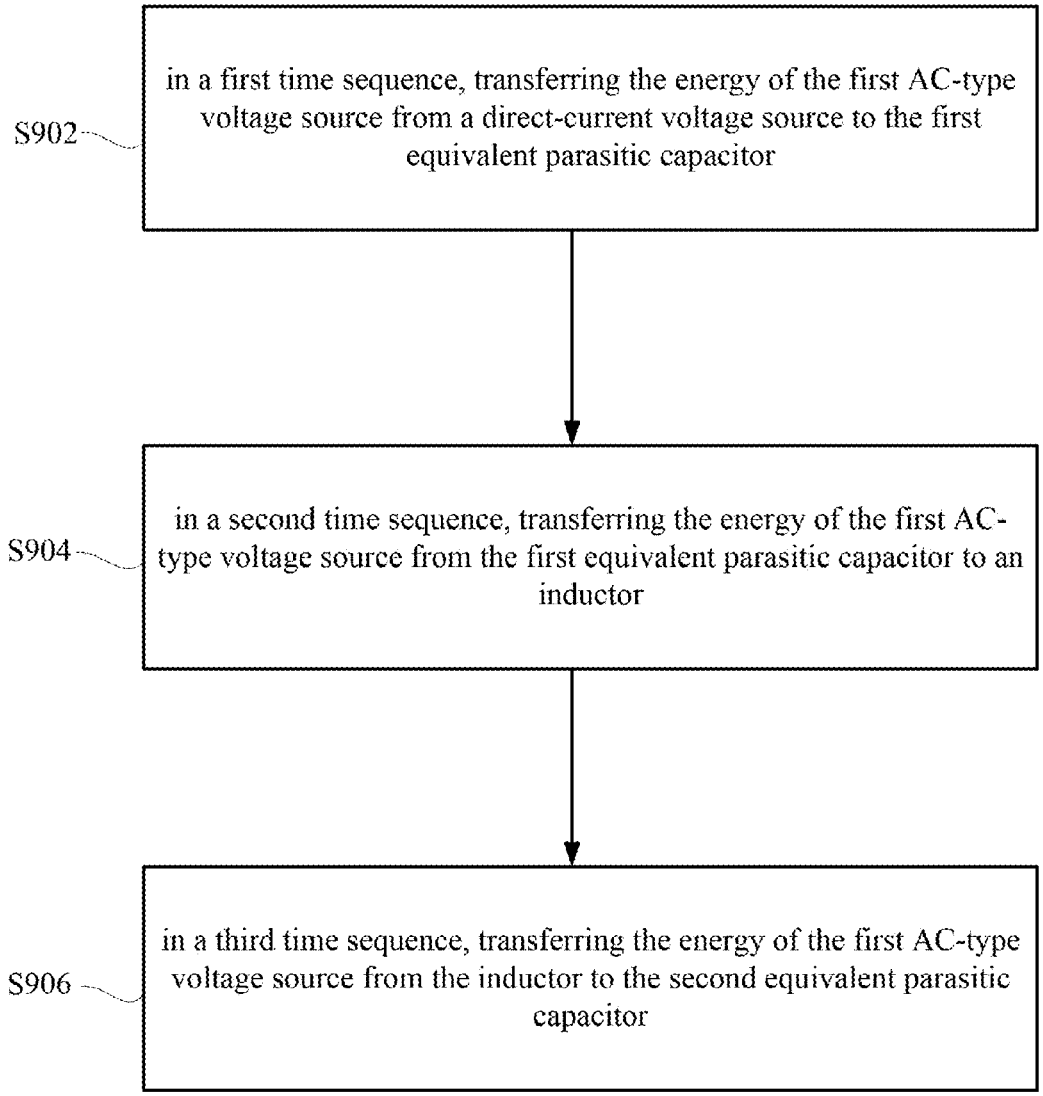
FIG. 9 is a schematic diagram of an energy recycling method according to an embodiment of the present disclosure.

FIG. 9 is a schematic diagram of an energy recycling method 900 according to an embodiment of the present disclosure. Firstly, in an initial time sequence, step S902 is executed for transferring the energy of the first AC-type voltage source from a direct-current-type (DC-type) voltage source to the first equivalent parasitic capacitor. Afterward, in a secondary time sequence, step S904 is executed for transferring the energy of the first AC-type voltage source from the first equivalent parasitic capacitor to an inductor. Afterward, in a tertiary time sequence, step S906 is executed for transferring the energy of the first AC-type voltage source from the inductor to the second equivalent parasitic capacitor. It should be noted that the initial time sequence, the secondary time sequence and the tertiary time sequence are different time sequences. The energy loss of the first AC-type voltage source is replenished by the DC-type voltage source.

To summarize, the present disclosure provides an energy recycling system and an energy recycling method thereof. The AC-type voltage source can be generated from the DC-type voltage source through the resonant circuit of the working circuits, in which the resonant circuit includes the equivalent parasitic capacitor of the working circuits and the inductor L (coupled as an external inductor unit or the parasitic inductor). Therefore, the energy can be transferred to the working circuits while the working circuits are processing the signals and the energy loss from transferring or the energy consumed in processing the operation of the signals by the working circuits can be replenished by connecting to the DC-type voltage source periodically. By utilizing the present disclosure, not only the dynamic power loss but also the severe leakage power loss caused from the advanced process can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An energy recycling system, comprising:
   a plurality of working circuits, comprising at least one first working circuit and at least one second working circuit, wherein the first working circuits and the second working circuits are alternately coupled with each other in series;
   a first energy recycling circuit, coupled between the first working circuits and the second working circuits, the first energy recycling circuit being configured for converting a direct-current-type (DC-type) voltage source to a first alternating-current-type (AC-type) voltage source, wherein the first AC-type voltage source is supplied to the first working circuits and the second working circuits;
   an inductor; and
   a plurality of pairs of switches, configured for conducting in different time sequences and transferring the energy of the first AC-type voltage source between the first working circuits, the inductor and the second working circuits.

2. The energy recycling system of claim 1, wherein the first working circuits have a first equivalent parasitic capacitor, and the second working circuits have a second equivalent parasitic capacitor, and the pairs of switches comprise:
   a first pair of switches, coupled between the DC-type voltage source and the first equivalent parasitic capacitor, the first pair of switches being configured for transferring the energy of the first AC-type voltage source from the DC-type voltage source to the first equivalent parasitic capacitor;
   a second pair of switches, coupled between the first equivalent parasitic capacitor and the inductor, the second pair of switches being configured for transferring the energy of the first AC-type voltage source from the first equivalent parasitic capacitor to the inductor; and
   a third pair of switches, coupled between the inductor and the second equivalent parasitic capacitor, the third pair of switches being configured for transferring the energy of the first AC-type voltage source from the inductor to the second equivalent parasitic capacitor.

3. The energy recycling system of claim 2, wherein the pairs of switches further comprise a fourth pair of switches coupled between the second equivalent parasitic capacitor and the DC-type voltage source, wherein the fourth pair of switches is configured for transferring the energy of the first AC-type voltage source from the DC-type voltage source to the second equivalent parasitic capacitor, wherein the third pair of switches transfers the energy of the first AC-type from the second equivalent parasitic capacitor to the inductor, and the second pair of switches transfers the energy of the first AC-type voltage source from the inductor to the first equivalent parasitic capacitor.

4. The energy recycling system of claim 3, wherein each of the first working circuits and the second working circuits comprises:
   a logic circuit, configured for generating an output signal according to an input signal and the first AC-type voltage source; and
   a register circuit, coupled with the logic circuit, the register circuit being configured for generating a memory signal according to the output signal and the first AC-type voltage source.

5. The energy recycling system of claim 4, wherein the logic circuit is an inverter, and in response to the input signal being at low level potential, the inverter outputs an upper half portion of an alternating-current signal as the output signal according to the first AC-type voltage source.

6. The energy recycling system of claim 4, further comprising:
   a plurality of first memory circuits, wherein the first memory circuits respectively coupled with the first working circuits, and the first memory circuits are configured for storing the memory signals of the first working circuits;
   a plurality of second memory circuits, wherein the second memory circuits respectively coupled with the second working circuits, and the second memory circuits are configured for storing the memory signals of the second working circuits; and
   a second energy recycling circuit, coupled with the first memory circuits and the second memory circuits, wherein the second energy recycling circuit is configured for converting the DC-type voltage source to a second AC-type voltage source, in which the second AC-type voltage source is supplied to the first memory circuits and the second memory circuits, wherein the second energy recycling circuit conducts in different time sequences and transfers the energy of the second AC-type voltage source between the first memory circuits, the inductor and the second memory circuits.

7. The energy recycling system of claim 6, wherein the second energy recycling circuit comprises:
   a fifth pair of switches, coupled between the inductor and the first memory circuits, the fifth pair of switches being configured for transferring the energy of the second AC-type voltage source from the inductor to the first memory circuits;
   a sixth pair of switches, coupled between the DC-type voltage source and the first memory circuits, the sixth pair of switches being configured for transferring the energy of the second AC-type voltage source from the DC-type voltage source to the first memory circuits; and
   a seventh pair of switches, coupled between the first memory circuits and the inductor, the seventh pair of switches being configured for transferring the energy of the second AC-type voltage source from the first memory circuits to the inductor.

8. A circuit layout method utilized in the energy recycling system of claim 6, wherein the method comprises:
   disposing a first metal trace configured for transferring the first AC-type voltage source; and
   disposing a second metal trace above and vertically overlapping to the first metal trace, wherein the second metal trace is configured for transferring the second AC-type voltage source, and the first metal trace and the second metal trace are not electrically coupled with each other.

9. An energy recycling method utilized in an energy recycling system comprising at least one working circuit and at least one second working circuit and a first energy recycling circuit, wherein the first working circuits and the second working circuits are alternately coupled with each other in series, and the first working circuits have a first equivalent parasitic capacitor, and the second working circuits have a second equivalent parasitic capacitor, and the energy recycling method comprises:
- in a first time sequence, transferring the energy of a first AC-type voltage source from a DC-type voltage source to the first equivalent parasitic capacitor;
- in a second time sequence, transferring the energy of the first AC-type voltage source from the first equivalent parasitic capacitor to an inductor; and
- in a third time sequence, transferring the energy of the first AC-type voltage source from the inductor to the second equivalent parasitic capacitor,
- wherein the first time sequence, the second time sequence and the third time sequence are different time sequences.

10. The energy recycling method of claim 9, further comprising:
- in a fourth time sequence, transferring the energy of the first AC-type voltage source from the DC-type voltage source to the second equivalent parasitic capacitor,
- in a fifth time sequence, transferring the energy of the first AC-type voltage source from the second equivalent parasitic capacitor to the inductor,
- in a sixth time sequence, transferring the energy of the first AC-type voltage source from the inductor to the first equivalent parasitic capacitor,
- wherein the fourth time sequence, the fifth time sequence and the sixth time sequence are different time sequences.

* * * * *